(12) United States Patent
Barrett et al.

(10) Patent No.: US 10,422,514 B2
(45) Date of Patent: Sep. 24, 2019

(54) LIGHT SOURCE MODULE

(71) Applicant: Sharp Kabushiki Kaisha, Osaka (JP)

(72) Inventors: Jacob Thomas Barrett, Oxford (GB); Karl Peter Welna, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 148 days.

(21) Appl. No.: 15/846,606

(22) Filed: Dec. 19, 2017

(65) Prior Publication Data

US 2019/0186717 A1 Jun. 20, 2019

(51) Int. Cl.
| | |
|---|---|
| *F21V 19/00* | (2006.01) |
| *F21V 29/503* | (2015.01) |
| *F21V 5/00* | (2018.01) |
| *F21V 29/70* | (2015.01) |
| *F21Y 115/30* | (2016.01) |

(52) U.S. Cl.
CPC .......... *F21V 19/0025* (2013.01); *F21V 5/007* (2013.01); *F21V 29/503* (2015.01); *F21V 29/70* (2015.01); *F21Y 2115/30* (2016.08)

(58) Field of Classification Search
CPC .... F21V 19/0025; F21K 9/00; G03B 21/2033
See application file for complete search history.

(56) References Cited

U.S. PATENT DOCUMENTS

| | | | |
|---|---|---|---|
| 9,360,745 B2 | 6/2016 | Song et al. | |
| 9,518,725 B2 | 12/2016 | Sasamuro et al. | |
| 9,726,329 B2 | 8/2017 | Matsuo et al. | |
| 2012/0218773 A1* | 8/2012 | Peiler | F21V 31/005 362/520 |
| 2012/0287954 A1* | 11/2012 | Saruwatari | H01S 5/02469 372/34 |

* cited by examiner

*Primary Examiner* — Evan P Dzierzynski
(74) *Attorney, Agent, or Firm* — Renner, Otto, Boisselle & Sklar, LLP

(57) ABSTRACT

A light source module includes a plurality of light sources mounted in at least one block. The block includes a mating surface for mating the at least one block to an adjacent block, and a plurality of mounting pads for respectively mounting the plurality of light sources, said mounting pads occupying multiple planes in a direction normal to a direction of light emission from the light sources. The mating surface is parallel to the direction of light emission from the light sources. Multiple blocks may be combined by joining the mating surface of a first block with a protrusion extending beyond the mating surface of an adjacent block. When the blocks are combined in this fashion, the mounting pads positioned in the multiple planes overlap in a viewpoint direction along an axis normal to the mounting pads. In this manner, light sources do not impede light emission from adjacent light sources.

20 Claims, 15 Drawing Sheets

LIGHT SOURCE MODULE

TECHNICAL FIELD

The invention relates to the grouping of multiple light sources into a single module, with application in fields that require the use of multiple light sources to produce a high radiant power system such as solid state projection, laser spotlights and industrial manufacturing lasers.

BACKGROUND ART

Solid state lighting devices, such as semiconductor laser devices and light emitting devices, are continuing to displace conventional incandescent sources in an increasing number of applications. There can be many advantages to using solid state lighting devices, including long lifetime, colour purity and energy efficiency, but in some applications the optical power of a single solid state light source device can be insufficient to directly replace the incumbent technology. In applications where it is necessary to have a higher radiant power than a single solid state light source device can deliver, multiple devices can be combined to provide the radiant power required. Examples of such applications include projection and laser machining.

Such applications require the beam from multiple solid state light sources to be combined to create a very high light intensity spot while maintaining a small footprint. This may be to create a very high power density on a surface to generate heat, or in order to preserve optical efficiency by reducing the beam cross section, for example when undergoing a light conversion process in a scattering medium. This creates another technical challenge that comes with the use of multiple solid state light sources; combining multiple devices needs to be done judiciously in order to achieve high optical efficiency within the system.

The performance characteristics of solid state lighting devices are closely linked to the temperature of the device. Because they are generally very small, they have a very high power to volume ratio, meaning that without adequate heat sinking, they can easily overheat and suffer reduced efficiency, or become damaged. This effect is particularly important for laser diodes, and technical solutions must be implemented to control the temperature of such devices.

Different applications require different radiant power systems. For example, a home theatre projector, to be used in a dark or dimly lit room, will require a lower peak brightness than a data projector, to be used in a well-lit office meeting room. Having a multiple light source system that is highly modular and can be scaled to suit the application is advantageous.

U.S. Pat. No. 9,726,329B2; Light source apparatus; Matsuo et al. issued Aug. 8, 2017; details a light source apparatus that can house a plurality of semiconductor laser elements. They are arranged in a planar format in a holding member. The holding member has holes aligned in at least a pair of rows, a thin walled section on which the holes are arranged, formed through providing at least a pair of depressions on one side, and a thick walled section provided adjacent to the thin walled section. The semiconductor laser device is disposed on the thick-walled section and the pair of terminals are exposed through holes from the other side of the holding member. A wiring substrate can be fitted inside the grooves formed by the depressions and thin and thick walled sections.

U.S. Pat. No. 9,518,725B2; Light Source Apparatus; Sasamuro et al. issued Dec. 13, 2016; describes an apparatus that arranges a first semiconductor laser device having a stem into a first holding member, and a second semiconductor laser device having a stem into a second holding member. The second holding member is placed on top of the first holding member and has a window portion through which light form the first laser device is emitted. The stem of the laser device in the first holding member overlaps with the stem of the second laser device when viewed from a light-emitting side.

U.S. Pat. No. 9,360,745B2; Light source assembly and projector having the same; Song et al. issued Jun. 7, 2016; describes a light source assembly for a projector. This comprises an arrangement whereby multiple light sources are disposed on a first body in a first plane to emit light, and a second array of light sources are disposed on a second body in a second plane, spaced apart from the first plane at a set interval and wherein the second light sources emit light between the adjacent first light sources via through holes in the first body.

The prior art describes arrangements to combine multiple light sources in fixed assemblies. U.S. Pat. Nos. 9,518,725B2 and 9,360,745B2 describe solutions to arrange multiple semiconductor laser devices in multiple holding members to create a reduced cross section of the combined beam but do not have an arrangement that allows for size variation of the assembled module, and so do not present a scalable solution.

SUMMARY OF INVENTION

This invention describes a module for tight packing of multiple light sources that is also scalable. Keeping the combined cross section of multiple beams as small as possible can reduce the size of the optics required for manipulating the collective output beam. It can also enable better optical efficiency. For example, when the light interacts with a scattering medium, a smaller beam on the medium will reduce the area of the effective source, meaning that for a particular lens, more of the light may be collected. A smaller footprint of a light source module can help to reduce the overall size of the system into which the module is placed. A scalable light source module can be used to address different applications and models of devices that require different radiant power systems. None of the prior art provides means for combining multiple light sources in a tight packing arrangement in a modular, scalable solution.

In one aspect of the invention, a light source module is comprised of tessellating blocks designed for holding multiple light sources. Each block comprises at least two mounting pads for light source, and each mounting pad is positioned on one of multiple parallel planes such that the base portion of each light source within a mounting block can overlap those in a different parallel plane when viewed normal to the plane of the mounting pad. The mounting pads are positioned such that a segment of each mounting pad protrudes the block on one side, and an opposite side has a complementary recess such that a second block with complementary design can tessellate to form a tightly packed light source arrangement, with overlapping of the profile of the light source. Multiple blocks can be tessellated in any number to match the radiant power required by the application.

An aspect of the invention, therefore, is a light source module for tight packing of multiple light sources that is also scalable. In exemplary embodiments, the light source module includes a plurality of light sources mounted in at least one block; the at least one block including a plurality of mounting pads for respectively mounting the plurality of light sources, said mounting pads occupying multiple planes in a direction normal to a direction of light emission from the light sources; and the at least one block further including a mating surface for combining the at least one block with an adjacent block, wherein said mating surface is parallel to the direction of light emission from the light sources.

These and further features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the claims appended hereto. Features that are described and/or illustrated with respect to one embodiment may be used in the same way or in a similar way in one or more other embodiments and/or in combination with or instead of the features of the other embodiments.

BRIEF DESCRIPTION OF DRAWINGS

FIG. 3b Shows a rear isometric view of the module in FIG. 3a

FIG. 4b Shows a front isometric view of the light source module in FIG. 4a

FIG. 6b Shows an exploded view of the block shown in FIG. 6a.

FIG. 7b Shows a front isometric view of the front of the module in FIG. 7a.

FIG. 7c Shows a back isometric view of the back of the module in FIG. 7a.

FIG. 10b Shows a partially exploded view of the light source module in FIG. 10a.

FIG. 12b Shows a front isometric view of the wheel in FIG. 12a.

DESCRIPTION OF REFERENCE NUMERALS

Figure 1B:
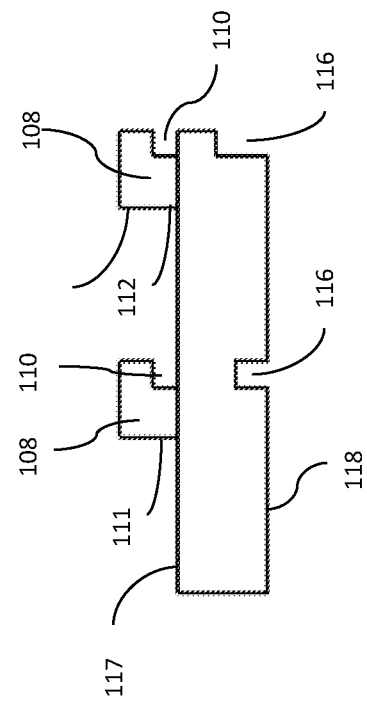
FIG. 1b Shows a side view of a block without assembled diodes, normal to the direction of light emission.
Figure 1D:
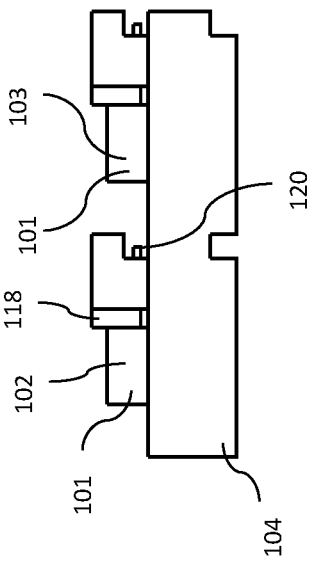
FIG. 1d Shows a side view of a block with assembled diodes, normal to the direction of light emission.
Figure 1A:
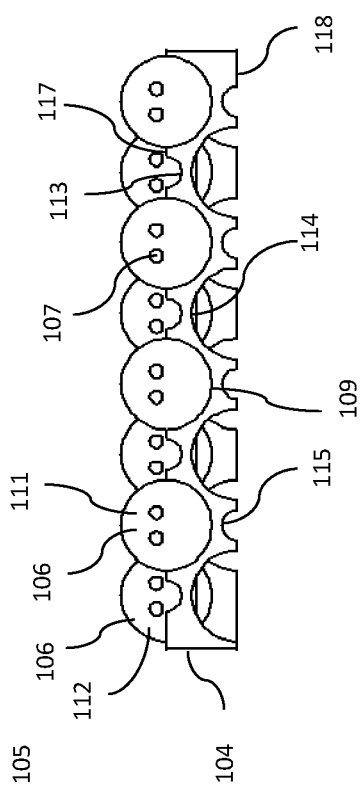
FIG. 1a Shows a front view of a single block without assembled light sources, normal to the mounting pad mating surface.
Figure 1C:
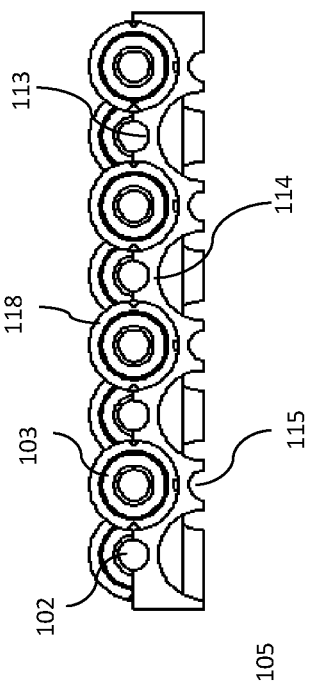
FIG. 1c Shows a front view of a block with assembled light sources, along the direction of light emission.

[101] Light Source
[102] Front Mounted Light Source
[103] Rear Mounted Light Source
[104] Block
[105] Light Source Module
[106] Mounting pad
[107] Hole for electrical terminals
[108] Protruding Segment
[109] Recess for light source
[110] Grooves for electrical connection means
[111] Front Mounting Pad
[112] Rear Mounting Pad
[113] Light Channel
[114] Mating recess
[115] Mating Light Channel
[116] Mating grooves for electrical connection means
[117] Leading planar face
[118] Trailing planar face
[119] Light source base portion
[120] Electrical terminal
[201] Bottom capping block
[202] Top capping block
[203] Electrical Connection Means
[204] Enclosed Recess
[205] Channels for electrical connection means
[206] Through hole (windows)
[301] Channels for Electrical Terminals

[601] Front block section
[602] Rear Block section
[603] Sandwich element
[604] Through holes in sandwich element
[605] Heat transport means
[701] Heat sinking means
[801] Laser Diode
[802] Substrate
[803] Lens
[804] Shell
[805] Semiconductor Chip
[806] Connecting wires
[901] Retaining feature
[902] Lens array
[1001] Flange for mounting
[1002] Through hole in flange for screw
[1003] Threaded hole for screw
[1004] Fin
[1005] Top surface
[1006] Through hole in block for screw
[1101] Focusing lens
[1102] First collimating lens
[1103] Beam Splitter
[1104] Integrating Element
[1105] Imaging Device
[1106] Wheel
[1107] Segmented Ring
[1108] Focusing lens pair
[1109] Collimating lens (blue)
[1110] Integrator focusing lens
[1111] Back collecting lens (after integrator)
[1112] Folding mirror
[1113] Projection system
[1201] Reflective disc
[1202] First Light Conversion Element
[1203] Second Light Conversion Element
[1204] Diffuser

DETAILED DESCRIPTION OF INVENTION

A light source module [105] for holding multiple light sources [101] is described herein. Referring to FIGS. 1a, 1b, 1c and 1d; in an aspect of the invention, a module [105] comprises one or more blocks [104] designed to house multiple light sources [101]. Each block [104] comprises a plurality of mounting pads [106] for attachment of light sources [101]. Each block comprises at least two light sources [101] attached to mounting pads [106]. Optionally the block [104] is made of a thermally conductive material, for example copper or an alloy of copper, or aluminium or an alloy of aluminium. The block [104] can also be made of two or more fused materials, for example one part made of alloy A and second part made of alloy B.

In an aspect of the invention, the mounting pads [106] within a block [104] are arranged in two rows disposed alternately between two or more substantially parallel planes, and may be integrally formed within the material of the block [104]. The mounting pads [106] provide an affixation point for each light source [101]. The planes in which the mounting pads [106] are disposed are offset from one another in the direction of light emission (i.e. along an axis normal to the mounting pad [106]) at a distance such that one light source [101] can be accommodated fully when affixed to a mounting pad [106], without obstructing a light source [101] affixed to a mounting pad [106] in a different plane.

In an aspect of the invention, the mounting pads [106] within a block [104] are located such that when the light sources [101] are mounted onto said mounting pads [106], and viewed along an axis normal to said mounting pads [106], the base portion [119] of each light source (see, e.g., FIG. 3a) may overlap with another light source base portion [119], but the beam is not substantially blocked.

In an aspect of the invention, the mounting pads [106] are located such that a segment [108] of the mounting pad [106] will protrude at least partially from the leading planar face [117] of the block [104], such that when light sources [101] are mounted, the side face of the mounting pad [106] and side of the light source [101] are exposed when viewed from a hemisphere normal to the leading planar surface [117] of the block [104].

In an aspect of the invention, the face opposite to the leading planar face [117] of the block [104], called the trailing planar face [118], has recesses [109] disposed within the block [104] such that they are complementary to the protruding mounting pads [108] from the preceding block [104], and tessellate with the mounting pads [106] to enclose the light sources [101] of the preceding block and create a similar two-dimensional overlapping structure to the single dimension overlapping structure within a row of a single block [104]. Any multiple of blocks [104] may be combined and tessellated in this fashion to create a two dimensional array of light sources [101].

Optionally, the blocks [104] may be geometrically similar but not of identical construction, such that when two blocks [104] are combined, the two sides adjacent to the leading planar surface [117] of the preceding block and the two sides adjacent to the trailing planar surface [118] of the successive block [104] are flush.

Figure 2B:
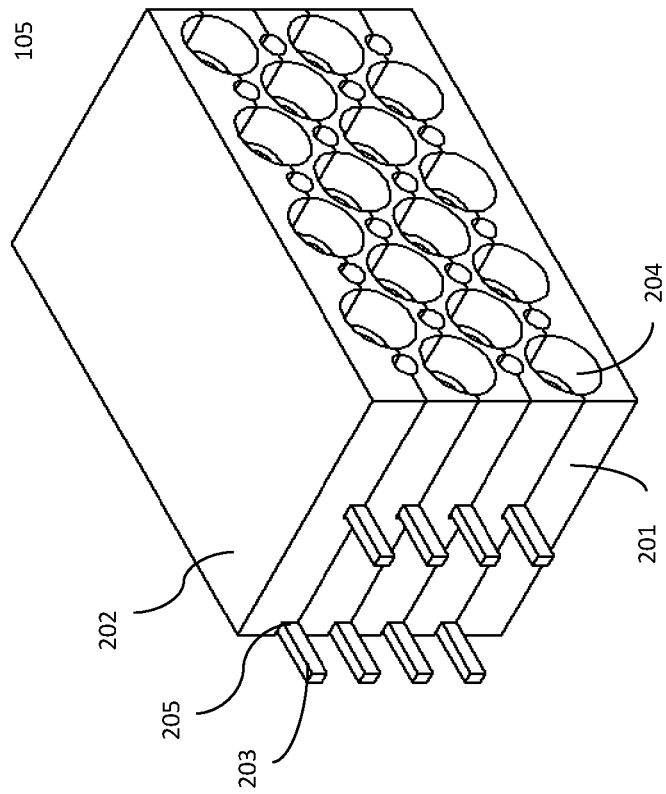
FIG. 2a Shows a front view of a 5 blocks light source module, along the direction of light emission. Electrical connection means are disposed to the rear of the mounting pads FIG. 2b Shows a front isometric view of the module in FIG. 2a FIG. 3a Shows a front view of a block without assembled light sources. Channels provided for the light source electrical terminals can be seen.
Figure 2A:
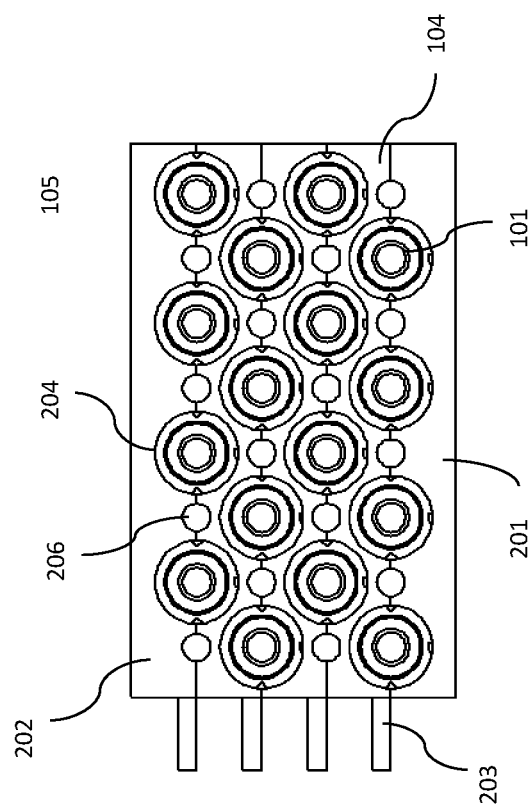

Referring to FIGS. 2a and 2b, optionally, a module [105] may include either or both of a bottom capping block [201], and a top capping block [202]. A bottom capping block [201] serves to provide the base block [104] for the mounting of light sources [101] and to provide a planar or otherwise complementary mating surface for attachment to a mount. A top capping block [202] serves to enclose the mounting pads [106] and light sources [101] in the upper block [104], and also has a planar or otherwise complementary mating surface for attachment to a mount.

Optionally each mounting pad [106] of module [105] (as described in FIG. 1a) includes holes [107] that pass through the mounting pad [106] to the rear face (opposite to the direction of emission) of the mounting pad [106] for connection of the electrical terminals [120] (see, e.g., FIG. 3b) of the light sources [101] to the electrical connection means [203]. These electrical connection means [203] are connected in a network to supply power to the light sources [101]. These may be connected in series or in parallel, depending on the nature of supply and may have a secondary connection means for connecting all of the primary electrical connection means [203] together, for a reduced number of individual connections to the power supply.

Optionally the front mounting pads [111] have holes [107] that pass the length of the module [105] to the rear surface, in between the spacing of the rear mounting pads [112].

Optionally a block [104] may contain grooves [110] that extend behind the mounting pads [106] in a direction parallel to the mounting pad [106] surfaces, to allow an electrical connection means [203] to be disposed behind each row of mounting pads [106] in a block [104] without compromising thermal contact of the light source [101] to the block [104]. Holes [107] are disposed in the mounting pads [106] to allow the routing of the electrical terminals

[120] of each light source [101] through said mounting pads [106] to the electrical connection means [203]. When multiple modules are combined, the grooves [110] are enclosed by the surface of the successive block to become channels [205] for containing said electrical connection means [203]. Said electrical connection means [203] may be for example rigid, or flexible PCB (printed circuit board) wires or otherwise.

Figure 3B:
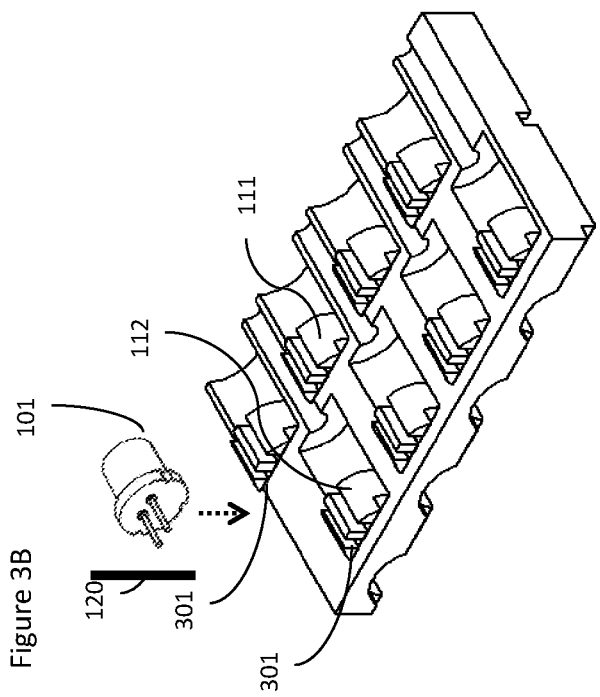
Figure 3A:
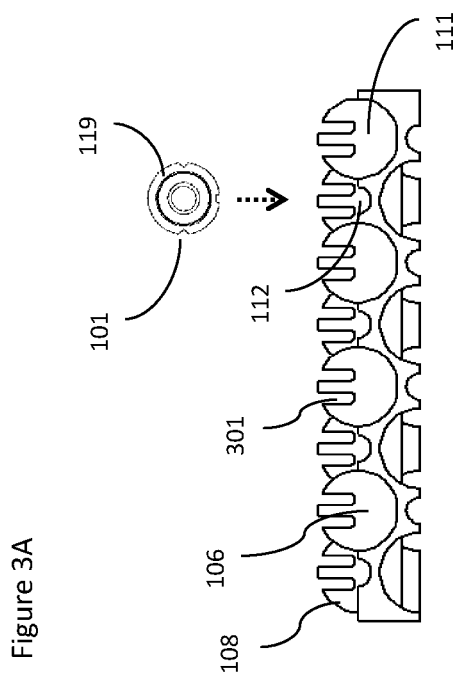

Referring to FIGS. 3a and 3b, optionally the protruding segments [108] of the mounting pads [106] have channels [301] formed in them, so as to allow the electrical terminals [120] of a light source [101] to pass through the mounting pad [106] when a light source [101] is being assembled onto the mounting pad [106]. Said channels [301] run from the edge of the mounting pad [106] to the position at which the electrical terminals [120] of the light source [101] device align when the light source [101] is seated in a final assembled position, to allow the electrical terminals [120] of the light source [101] devices to be inserted with the base portion [119] in-plane with the mounting pad [106]. This allows the distance between the rear surface of the front mounting pad [111] and the front surface of the rear mounting pad [112] to be less than the length of a light source [101], because the terminals [120] of the light source [101] can be passed through these channels [301] during assembly.

Referring to FIGS. 3a and 3b, in one embodiment, the light source [101] is firstly arranged so that the mating surface of the mounting pad [106] and the mating surface of the base portion [119] of the light source [101] are in the same plane, and the electrical terminals [120] of the light source [101] pass through the channels [301] in the mounting pad [106] until the two surfaces are in a final mating position.

In another embodiment either one or both the mounting pad [106] and electrical connection means [203] comprises a feature to grip the electrical terminals [120] of the light source [101] such that the light source [101] can be securely held in place.

Figure 4B:
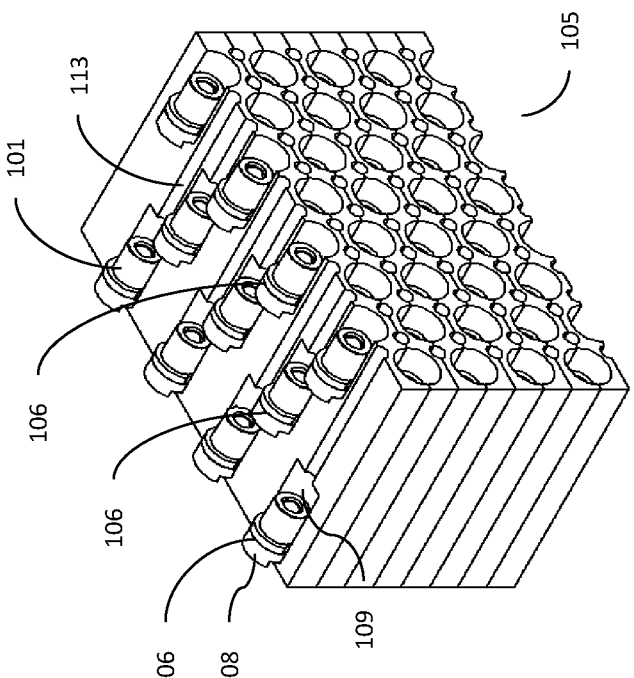
Figure 4A:
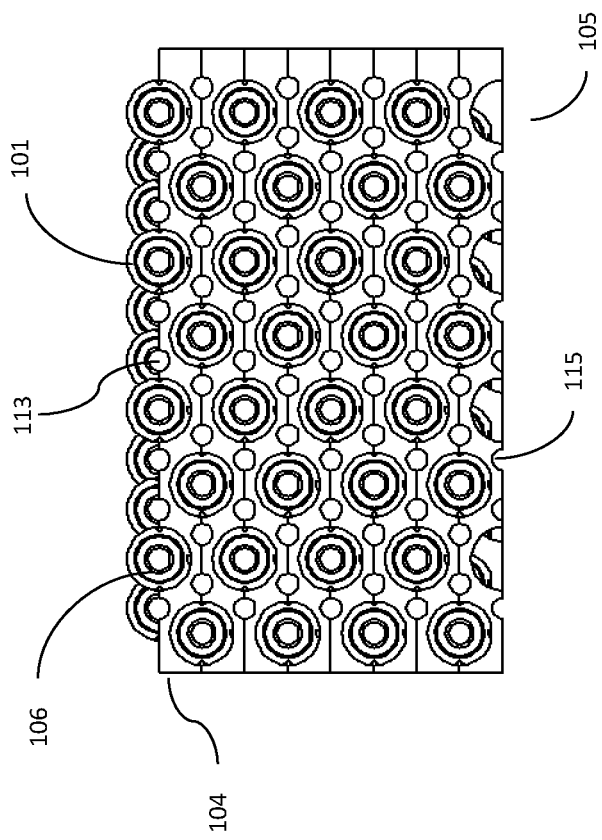
FIG. 4a Shows a front view of an 8 blocks light source module, along the direction of light emission. Each block has 3 layers, and the mounting pads form a hexagonal arrangement along the direction of light emission.

Referring to FIGS. 4a and 4b, in an embodiment, mounting pads [106] are disposed among three or more parallel planes, such that the separation between each plane is greater and heat dissipation is more effective due to the increased spacing between light sources [101] or such that the in-plane density of light sources [101] is higher.

Figure 5:
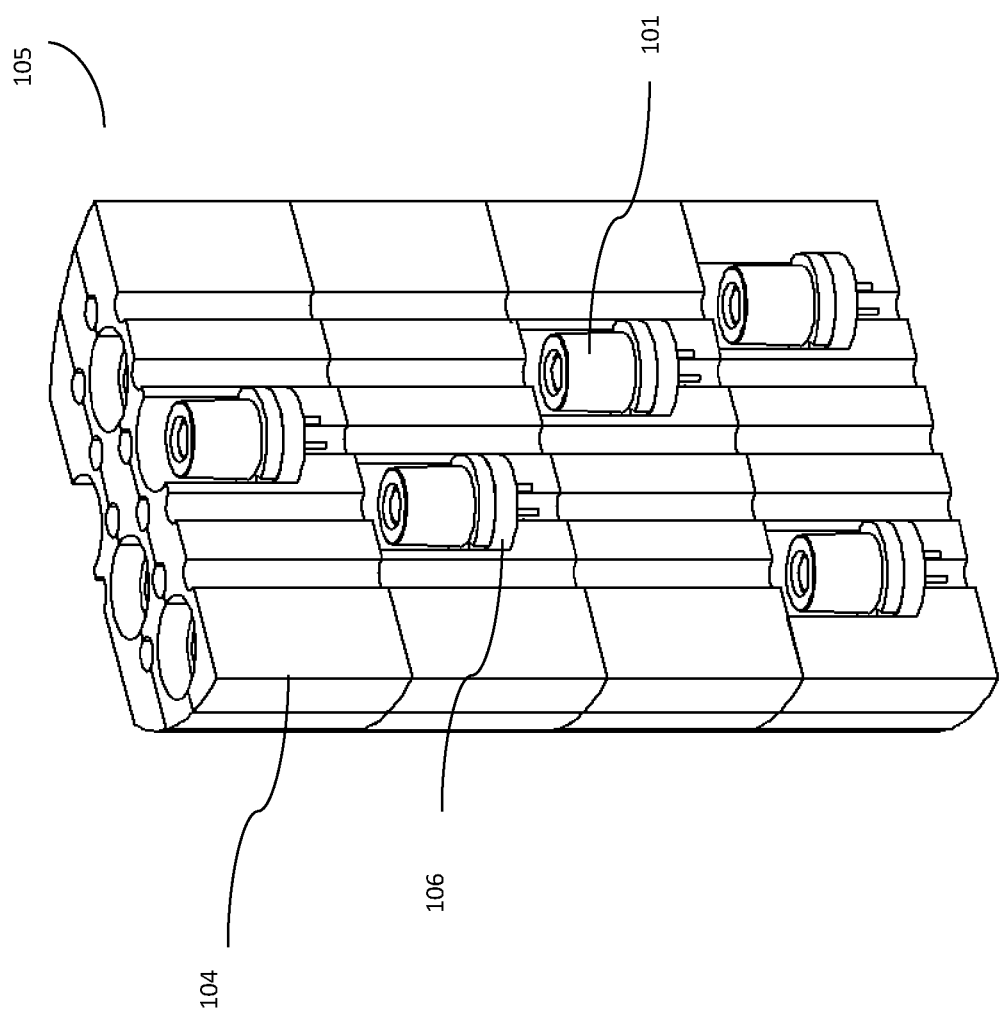
FIG. 5 Shows an isometric view of a 3 block light source module, along the direction of light emission. Each block has 4 layers, and the mounting pads form a hexagonal arrangement in the assembled module, along the direction of light emission. The mounting pads are arranged in an irregular fashion to allow maximum distance between light sources in a layer.

Referring to FIG. 5, in another embodiment, mounting pads [106] are disposed among tessellating blocks over two or more planes in such a way that the arrangement of mounting pads [106] across the planes is irregular, and each block [104] may have a different configuration. Furthermore, the mounting pads [106] disposed in a row within the block [104] might differ in position between different blocks [104]. Light sources [101] are disposed on the mounting pads [106]. Optionally, a light source module [105] has the same configuration of blocks [104] and mounting pads [106] described above, but the light sources [101] are disposed on specific mounting pads [106], i.e. there might be mounting pads [106] with no light source [101] present.

Figure 6B:
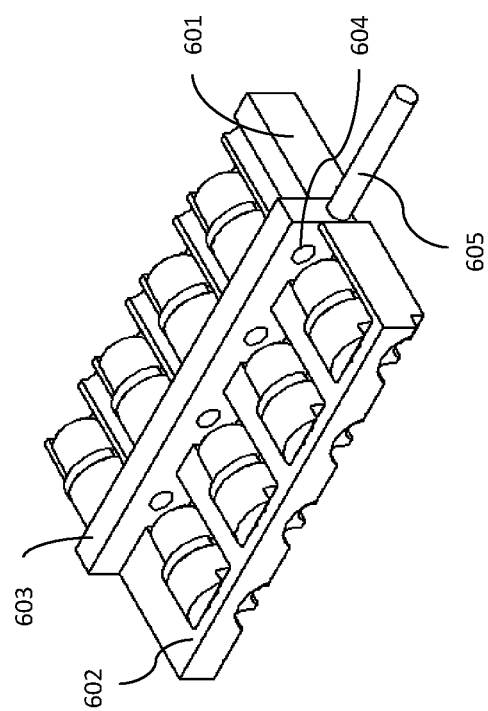
Figure 6A:
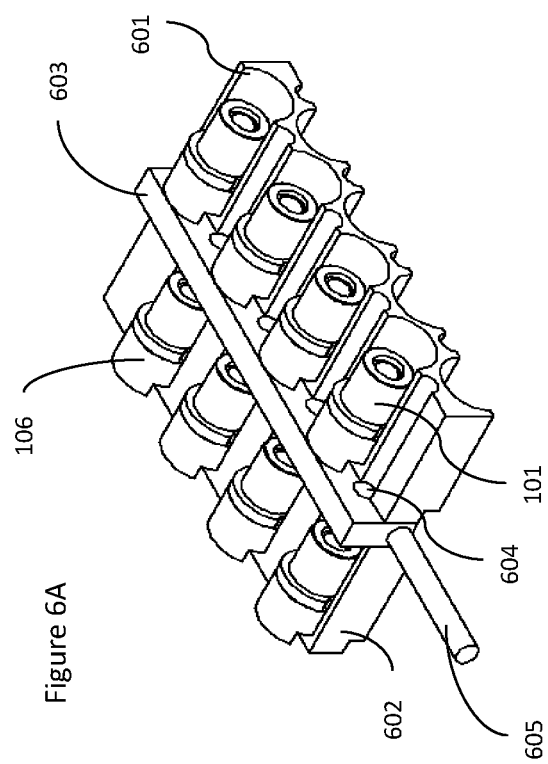
FIG. 6a Shows a rear isometric view of a sectioned front and back block for a light source module, without assembled light sources. Disposed between the sections is a sandwich element with embedded heat transport means, to move heat away from the light sources.

Referring to FIGS. 6a and 6b, optionally, a block may be comprised of two sections [601], [602]; the front row of light sources [101] is disposed on a front section [601] and the rear row of light sources [101] is disposed on a rear section [602], and a sandwich element [603] is disposed between the front and rear sections. The sandwich element [603] contains through holes [604] concentric with the beam of the rear sources, to allow light to pass. The sandwich element [603] may also have embedded heat transport means [605] for the dissipation of heat, such as for example a heat pipe or liquid cooling means.

Figure 7B:
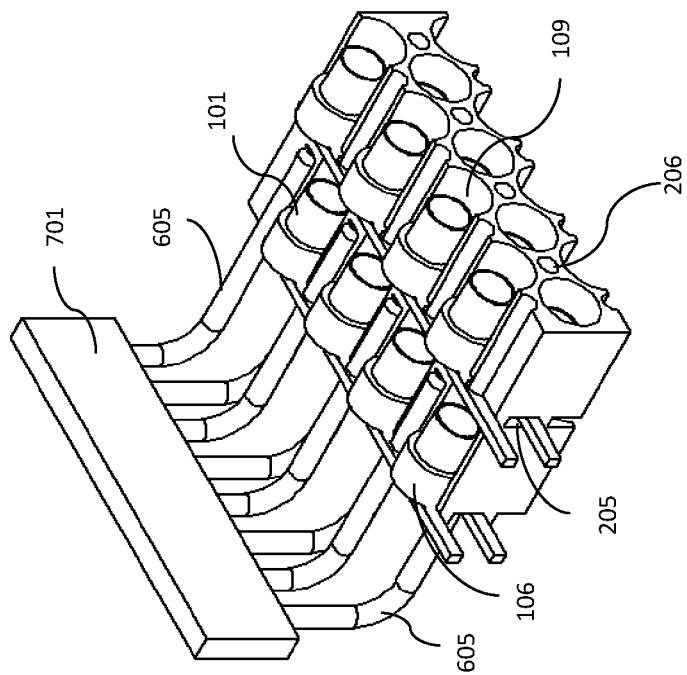
Figure 7A:
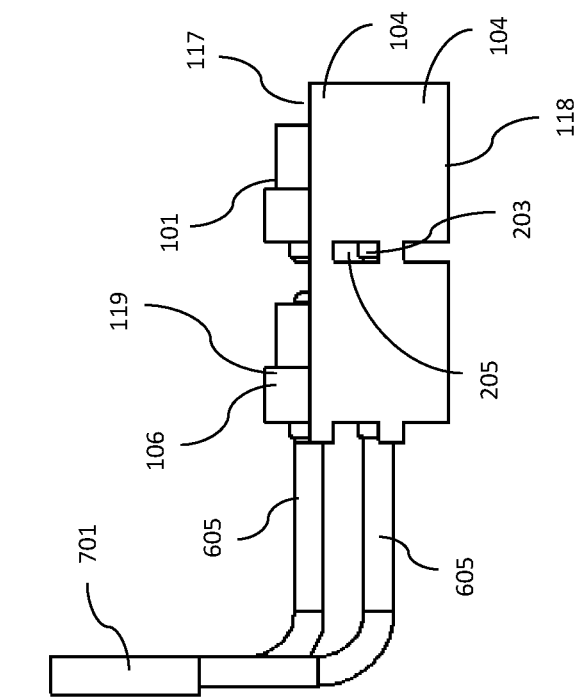
FIG. 7a Shows a side view, normal to the direction of light emission, of a module comprising 2 tessellated blocks with assembled light sources. Heat transport means are embedded in the blocks and are attached to a heat dissipation means.
Figure 7C:
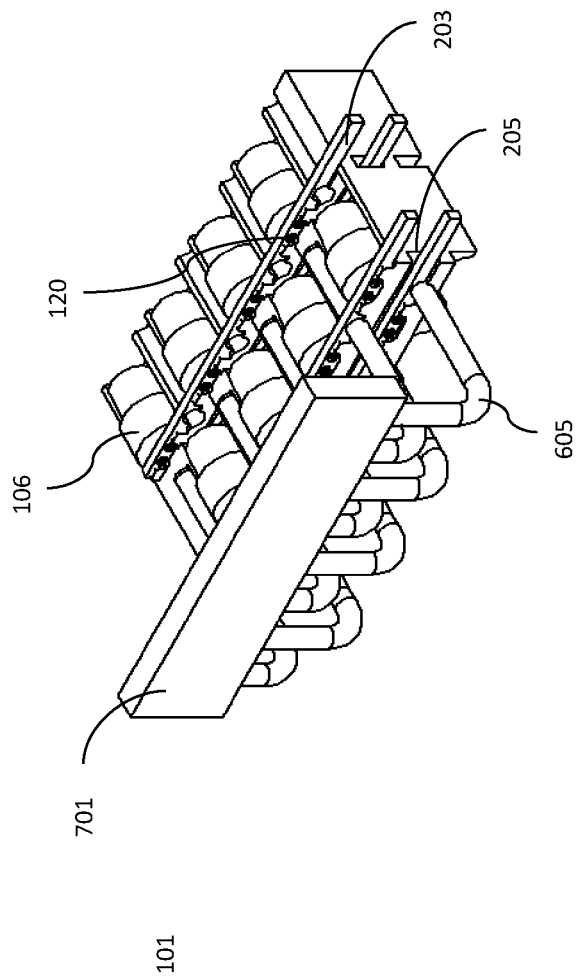

Referring to FIGS. 7a, 7b, and 7c, optionally, heat transport means [605] are disposed embedded within the rear side of the module [105], behind the front row of mounting pads [111], such that light source packing is not compromised but heat can be carried away from the module effectively. These for example may be separated heat transport means [605], may be connected in series or may be a single, continuous means.

Optionally, a block [104] may include integrated fin type features to provide increased surface area and aid heat dissipation to air. These may protrude from any surface of the block [104] and run in any direction that does not cause them to occlude any part of the output beams.

In one aspect of the invention, the assembly of a light source module [105] is achieved through firstly assembling light sources [101] into a block [104]. The light sources [101] are mounted to a mounting pad [106]. The number of light sources [101] assembled into a block is determined by the radiant power requirement of the application. In one embodiment, the locating of light source devices [101] onto a mounting pad [106] is achieved through firstly placing each light source [101] into a recess [109] in the block before translating the light source along a direction normal to the mounting pad [101] and towards the mounting pad [106], to pass the terminals [120] of the light source device [101] through the holes [107] or channels [301] in the mounting pad [106] until the mounting pad [106] and base portion [119] of the light source [101] are coincident. Electrical connections are made between the terminals of each light source device [101] and the electrical connection means [203]. Said electrical connection may be for example soldering or through mechanical pressure. Once a block [104] is populated with the required number of light sources [101], a successive block [104] is then added to the module [105] such that it tessellates with the preceding block [104]. The successive block [104] is positioned on top of the preceding block [104] such that the leading planar face [117] of the preceding block [104] and trailing planar face [118] of the successive block [104] are coincident. The cylindrical face of the protruding segment [108] of the mounting pads [106] of the preceding block [104], are also coincident with the recesses [109] of the successive block [104] to enclose the side of each light source device [101]. Some or all of the coincident surfaces of the two blocks [104] may be simply in direct contact, may have screws or clamps providing a retention force, may have a thermally conductive cavity-filling material or adhesive or may be soldered or otherwise bonded together.

In another aspect, each light source base portion [119] is mounted and may be interfacing a mounting pad [106] on the block [104]. The light source [101] may be mounted by a bonding material, clamping, screws or other attachment means. Optionally the bonding material may be for example, thermally conductive adhesive, or solder. The mounting pad [106] is substantially the same profile as the light source base portion [119] or at least the majority of the contact surface of the light source base portion [119] is in contact with the mounting pad [106], in order to promote effective heat transfer. Optionally, the light sources [101] may be loaded sideways onto the mounting pad [106] such that the mounting pad [106] is parallel to the base portion [119] of the light source [101]. Thermally conductive paper or paste might be disposed between the mounting pad [106] and the base portion [119] of the light source. Optionally, an open wedge configuration, disposed on the block [104] around the mounting pad [106], may be used to push the light source [101] against the mounting pad [106]. Optionally, the light source [101] can be fixated by solder, adhesive or screws.

Figure 8B:
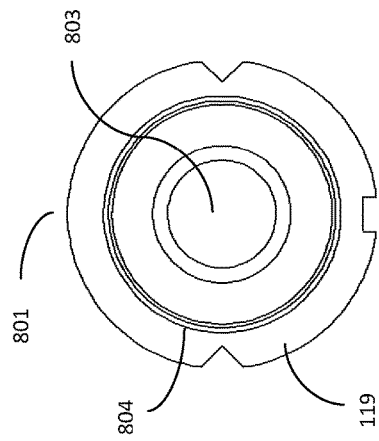
FIG. 8b Shows a front view of a laser diode light source with integrated lens, along the direction of light emission.
Figure 8C:
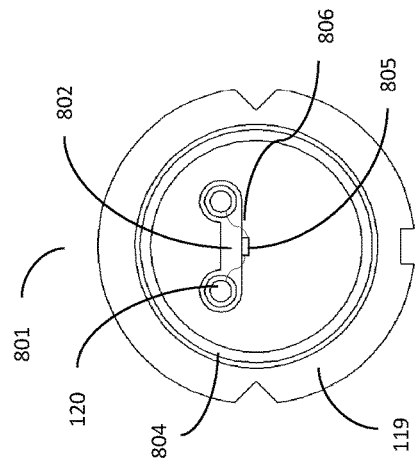
FIG. 8c Shows a front view of a laser diode light source without integrated lens, along the direction of light emission.
Figure 8A:
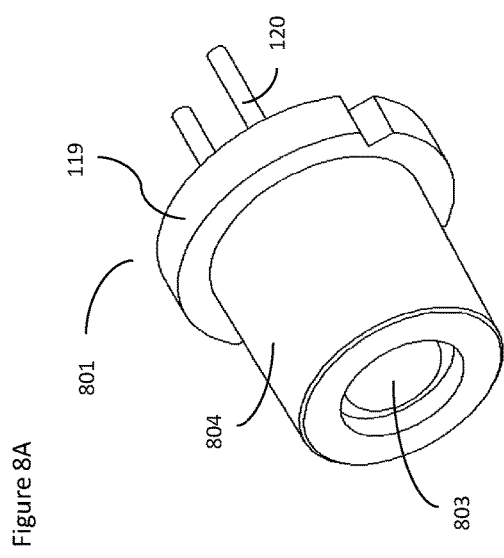
FIG. 8a Shows a front isometric view of a laser diode light source with integrated lens.

In one embodiment, the light sources [101] are semiconductor laser elements [801] as illustrated in FIGS. 8a and 8b. It is accepted that other shapes of [109] will be also usable. The laser light output may be from any part of the electromagnetic spectrum, including UV, visible and Infra-red light. Each laser elements [801] will emit at least one laser light beam but is not limited to one.

Referring to FIG. 8c, a laser diode [801] is typically comprised of a semiconductor chip [805], bonded to a metal substrate [802]. The metal substrate [802] is in turn bonded or otherwise attached to a base portion [119] that forms the connecting surface for interfacing the laser diode [801] to a mount. A shell [804] radially encloses the device atop the base portion [119]; optionally a lens [803] is disposed in front of the semiconductor chip [805] as shown in FIGS. 8a and 8b. Preferably the lens [803] is collimating. A collimating lens [803] is an optical element positioned in front of the semiconductor chip [805] to collimate the light output of the device, which may be naturally divergent and astigmatic. Optionally the lens [803] is held in place by the shell [804] of the assembly. Two connecting wires [806] connect the semiconductor chip [805] to two electrical terminals [120], which protrude from the base portion [119] of the laser diode [801] for supplying power to the device.

In another embodiment, the light sources [101] housed within the module [105] are comprised of two or more different emission wavelength laser elements [801]. Optionally these are laser elements [801] which emit laser light having wavelength around 450 nm, 525 nm and 625 nm (or close to), either in a combination of the three or more colours, or an array of a single colour. Optionally the current supplied to each different wavelength emitting set of laser elements [801] would be variable, such that the radiant power can be varied and the composite colour mixed of these laser elements would satisfy a range of colours, for example a colour space such as sRGB or BT.2020. Also, any other lasers having IR (800-1000 nm) or UV (200-400 nm) can be mounted.

In another embodiment the light sources [101] are laser diodes [801] and the laser light output is coupled into one or more optical fibres. Each optical fibre may for example be coupled onto a display device such that an image suitable for motion pictures may be produced.

Figure 9A:
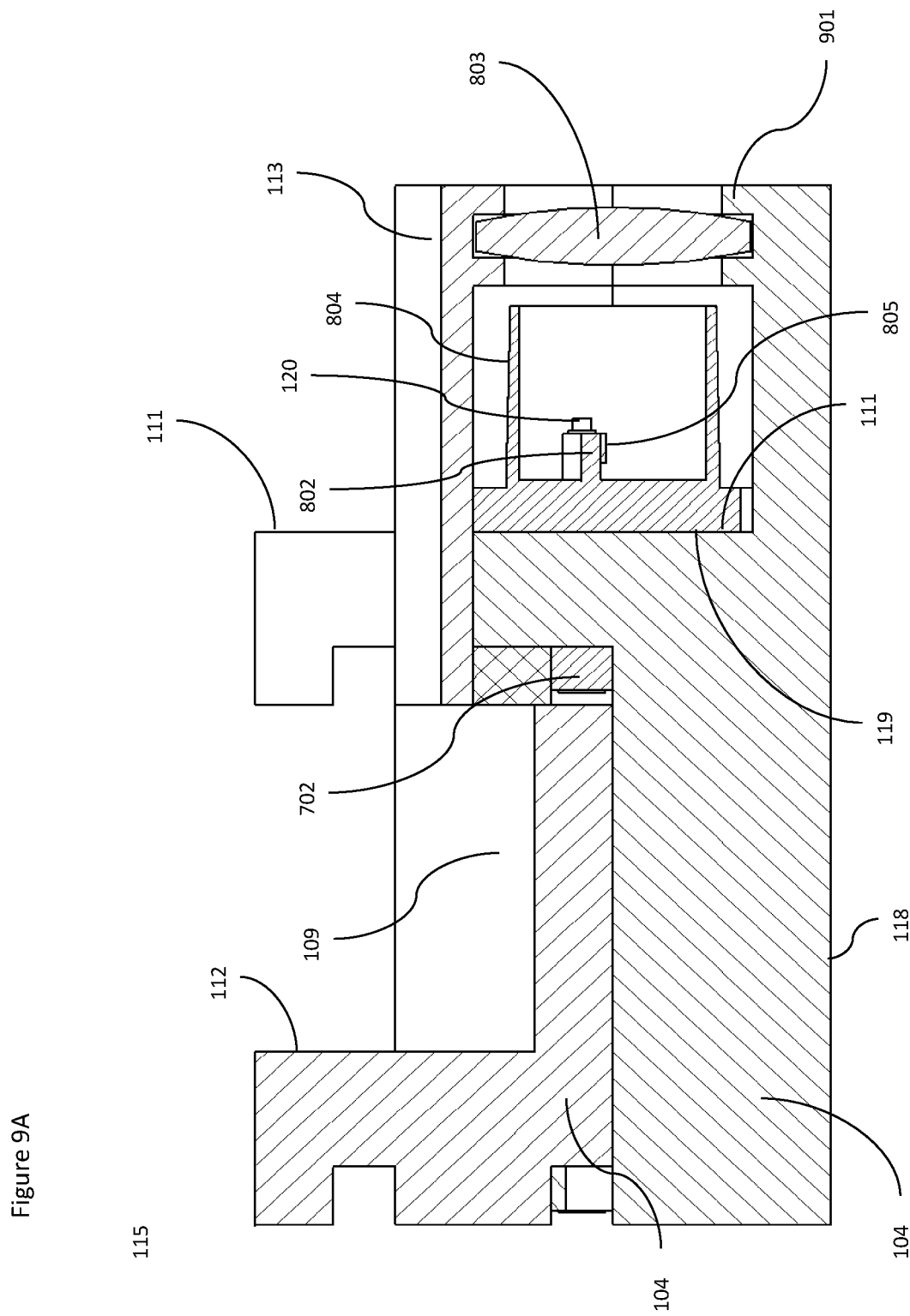
FIG. 9a Shows a section view from a side normal to the direction of light emission, of a light source module comprised of two blocks. The laser diode light source has no integrated lens. A lens is provided in front of the laser diode, and is held in place by a retaining feature which is formed in the recesses for a mating pair of blocks.
Figure 9B:
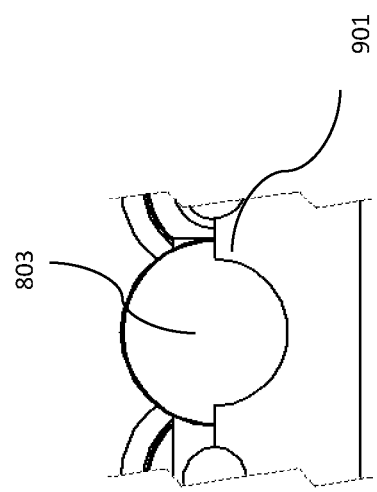
FIG. 9b Shows a cut view from the front, along the direction of light emission, of a lens positioned in a block. A second block (not shown) mates with the block to complete the retaining feature and hold the lens in position.
Figure 9C:
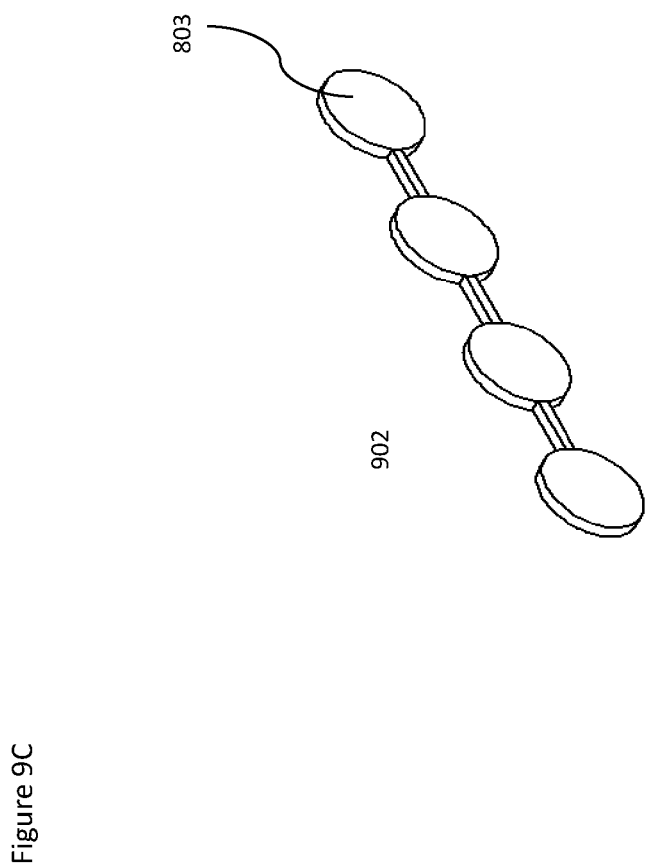
FIG. 9c Shows an isometric view of an example molded lens array.

Referring to FIGS. 9a and 9b, in another embodiment of the invention, the light sources [101] do not have an integrated lens [803]. Optionally a lens [803] is provided for each light source [101], external to the light source [101]. Each is held in place via a retaining feature [901] which holds the lens [803] in position when enclosed in a recess [109] and mating recess [114] by two mating blocks [104]. The retaining feature may be an integral narrowed section of the recess [109] and mating recess [114], or may be a separate component that can be affixed within the enclosed recess [204], by for example a threaded section in the enclosed recess [204], or by gluing. Referring to FIG. 9c, optionally a lens [803] for each light source may be provided as one or more pieces of a plurality of lenses forming a lens array [902]. A lens array [902] may be moulded, or formed from separate lenses [803] or assembled into a housing. The lens array [902] may then be clamped, screwed, glued, or otherwise affixed to the light source module [105].

Example 1: Two Blocks, Two Layers Light Source Module with Heat Pipes

Referring to FIGS. 7a, 7b and 7c; and 8a, 8b and 8c; in one example, each light source [101] is a laser diode semiconductor element [801] capable of generating laser light output. The semiconductor laser diode is a Gallium Nitride based laser diode that emits blue light with a peak wavelength in the range of 440-460 nm. The laser diodes [801] are of the type 9 mm TO-CAN, which has a circular base portion [119] 9 mm in diameter, and each is disposed on a mounting pad [106]. A pre-aligned and fixed lens may be placed in the TO-CAN to collimate the beam. Alternatively, a lens arrangement may be provided outside the can to collimate the beam from one or multiple laser elements housed within the module [105]. The laser diodes [801] are secured to the mounting pad [106] with solder. Each laser diode [801] has two contact terminals [120] that pass through two holes [107] between the circular faces of a mounting pad [106]. Behind the row of mounting pads [106] is disposed an electrical connection means [203] that is a printed circuit board (PCB) for connection of each pair of terminals [120]. For each terminal [120] of a laser diodes [801], a through hole solder connection is provided in the PCB, into which the terminal [120] is soldered. Each mounting pad [106] is a cylinder of 6 mm in length and 9 mm in diameter. Each mounting pad [106] is positioned such that a cylindrical segment is integral in the block [104] and the other half of the cylinder segment [108] protrudes above the leading planar surface [117] of the block [104]. The block is made of casted Aluminium alloy. There is a semi-circular cross-section recess [109] in the surface of the block [104] that is co-radial and co-axial with the mounting pad [106], such that each laser diode [801] can be positioned on a mounting pad [106], in the recess [109]. There is a front row of 4 mounting pads [106] with centres spaced 14 mm apart to accommodate 3 laser diodes. There is a second row of 4 mounting pads [106] with centres also spaced 14 mm apart and disposed 18 mm behind the front row of mounting pads [111], in a direction normal to the circular face of the mounting pads [106], measured mounting surface to mounting surface. The first mounting pad [106] of the rear row or mounting pads [112] has its centre displaced 7 mm from the centre of the first mounting pad of the front row of mounting pads [111] and in line with the axis of the front row, when viewed along the plane of emission, such that the row of laser diodes [103] mounted to the rear mounting pads [112] is positioned to emit a beam from each diode that propagates through the spacing either side of the diodes [801] in the front row. A light channel [206] the same width as the laser beam, 3 mm in diameter, is disposed between diodes in the front row to allow the emitted beam from the rear row to pass. Each block [104] is a thickness of 7 mm, so when they are combined, a spacing of 7 mm between each beam is maintained and a square packing arrangement produced. Within each block [104] are disposed heat transport means [605], these heat transport means being three heat transport means [605]. The heat transport means [605] are disposed in grooves formed in the block [104] such that they sit flush with the leading planar edge of the block [104]. The grooves run parallel with an axis normal to the mounting pads, such that the heat transport means run behind the front light sources [102] and in between the rear row of light sources [103]. The heat transport means [605] are at the opposite end connected to an array of fins to aid heat dissipation. A second block [104] similar to the first block but in a complementary arrangement is positioned with the front row of light sources

[102] being displaced 7 mm from the rear row of laser diodes [103], along the direction of the row, such that they aligned with the rear row of laser diodes [103] of the preceding block [104], along an axis normal to the leading planar face. Similarly the rear row of mounting pads [106] has the reciprocal arrangement, whereby the mounting pads [106] in the rear row are aligned with the front row of mounting pads of the preceding block, along an axis normal to the leading planar face. Similarly this block [104] has three heat transport means [605] disposed behind the front row of laser diodes [102]. A block [104] of the same arrangement as the first block [104] is disposed adjoining the leading planar face [117] of the second block [104]. This block [104] contains no laser diodes, but serves to enclose the laser diodes [801] disposed in the second block [104].

Example 2: 3-Layer Laser Diode Module

Referring to FIGS. 4a and 4b, a second example of the invention is now disclosed. The second example is similar to the first example and the common features will not be repeated. In the second example each block contains 3 rows of mounting pads [106]. There is a spacing of 21 mm between the centres of the mounting pads [106] in each row and a similar offset as in example 1 of 7 mm between the centres of each mounting pad [106] in successive planes. The height of each block [104] is 6.06 mm, and along the direction of each row of mounting pads, the displacement for between the first mounting pad [106] in the front row of each successive block is 10.5 mm, such that a hexagonal arrangement of the composite module is formed. This creates a tighter packing of the laser diode beams in the direction of emission, whilst also increasing the separation between diodes to improve heat dissipation.

Example 3: 4 Layer Irregular Pattern Light Source Module

A third example of the invention is now disclosed and described in FIG. 5. The third example is similar to the second example and the common features will not be repeated. In this example, a block [104] comprises 4 rows of mounting pads [106]. The mounting pads [106] are arranged in an irregular fashion within each block [104], such that the distance between light sources [101] within the same plane is maximised. For example in FIG. 5 it can be seen that adjacent rows do not necessarily have mounting pads [106] that are disposed in the next position along a row. The module [105] is tightly packed however, with a mounting pad [106] in each available row position to fill each block [106].

In this example, light sources [101] in the lowest row are semiconductor lasers with emission wavelength of 450 nm (blue), light sources in the second row are of 525 nm (green), light sources in the third row are of 625 nm (red) and light sources in the highest row are of 905 nm (IR). This module [105] emits mixed laser light of R+G+B+IR. Users can select wavelength of lasers to fit their products when utilizing this module.

Example 4: Five Blocks, Two Layers Laser Diode Module with Heat Sink

Figure 10B:
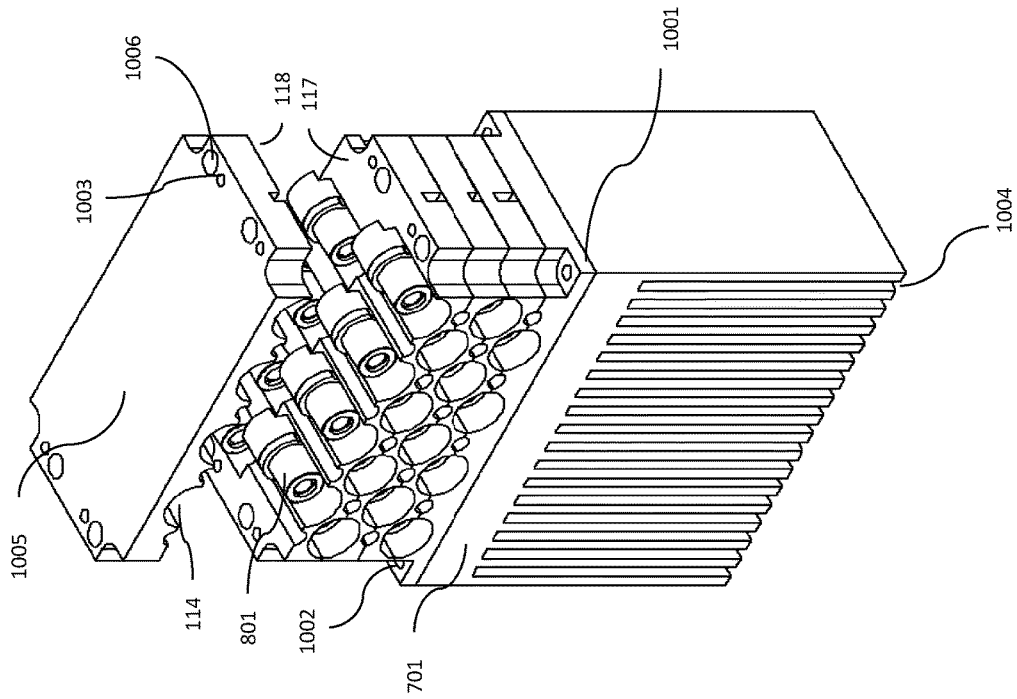
Figure 10A:
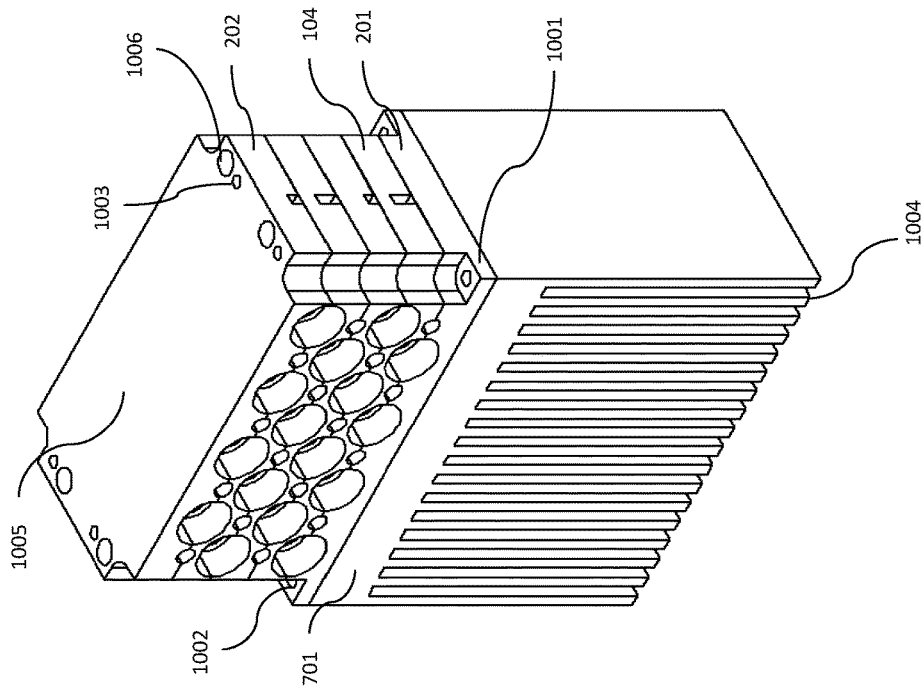
FIG. 10a Shows a front isometric view of a 5 blocks light source module with assembled light sources. The module has top and bottom capping blocks, mounting holes and is attached to a base heat sink.

A fourth example of the invention is now disclosed. The fourth example is similar to the first example and the common features will not be repeated. The described light source module [105] can be seen in FIGS. 10a and 10b. In this second example, the first block [104] is a bottom 'capping' block [201]. The mounting pads [106] in the front and rear row are disposed in the same arrangement as the first example. The trailing face [118] of the module is substantially planar, with no protrusions from the face or recesses disposed in the face. There are four flanges [1001] flush with the trailing face [118] of the block, one in each corner of the block [104]. In each flange [1001] is a hole [1002] for a 3 mm diameter screw. This allows the module [105] to be secured via screws to a planar heat sink interface. The heat sinking means [701] has a planar face with 4 threaded screw holes [1003] to align with the bottom capping block [201]. The heat sinking means [701] is an extruded aluminium arrangement with fins [1004] formed in the rear surface. The fins [1004] are each 50 mm high and 2 mm wide, with 2 mm spacing between fins [1004]. A fan may also be arranged to direct air over the fins [1004] and convect heat away from the arrangement. Each subsequent block [104] also has four pairs of holes in the leading planar surface [117], aligned one pair on each corner along the edges of the face. The first retaining hole [1006] of each pair is of a wider diameter (for example 6 mm) down to a shallow depth (for example 3 mm) from the base of the block, and of smaller diameter (for example 3 mm), through to the rear surface, such that a screw can be placed into the hole [1006] and the head of the screw retained, with the threaded body of the screw protruding from the rear surface of the block [104]. The second of each pair of holes are threaded holes [1003] for receiving the screw bodies that protrude from the trailing planar surface [118] of the next block [104]. The arrangements of threaded holes [1003] and retaining through holes [1006] are alternated for each block such that one block can be screwed into the preceding block to secure each block to the preceding block and form the module [105] together. The second block in the module is of the same construction as the second block in the first example, such that there are both recesses [109] in the trailing planar face [118] and also mounting pads [106] disposed in the leading planar face [117]. The third block is a top capping block [202], similar to the bottom capping block [201], though designed to tessellate with the leading face [117] of the second block [104]. The top capping block [202] contains semi-circular mating recesses [114] for enclosing the mounting pads [106], laser diodes [801]; and semi-circular light channels [113] to allow light from the rear row of laser diodes [801] of the preceding block [104] to pass, though it has a flat leading planar surface [117], such that a second planar heat sink interface may be adjoined to this top surface [1005]. The top capping block [202] may be connected to a top heat sinking means [701]. This top heat sinking means [701] may be of similar finned [1004] structure to the bottom heat sinking means [701], and has retaining holes [1006] for inserting screws between the top heat sinking means [701] and the top capping block [202].

Example 5: Two Layer Laser Diode Module for Phosphor Pumped Laser Projection

Figure 11:
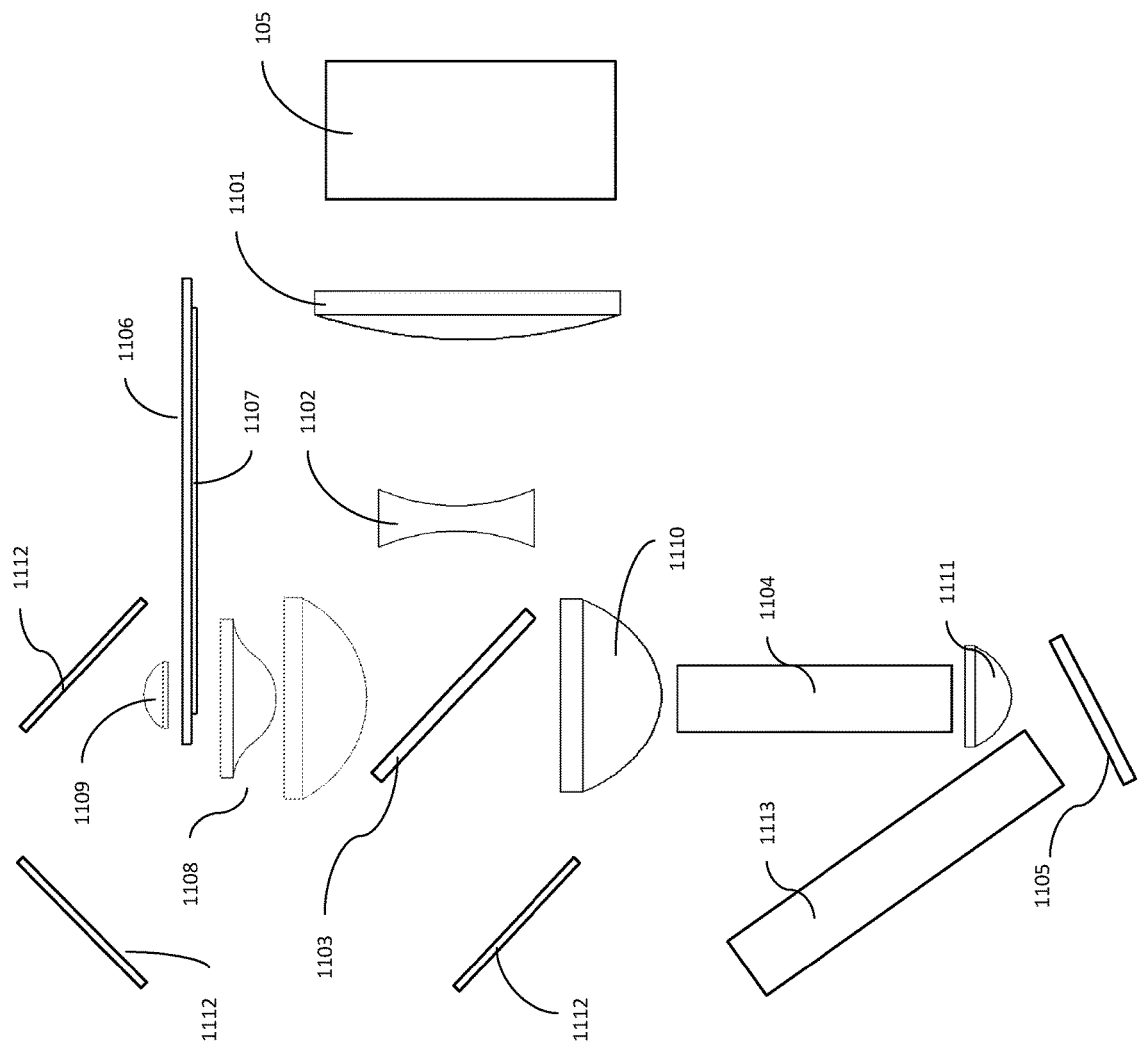
FIG. 11 Shows a schematic of a laser light source module pumped phosphor projection engine.

In a fifth example as illustrated in FIG. 11, the light source module [105] described in example 2 is utilised in an arrangement to produce composite white light output for a video projector. Each of the optics in the system preferably has an anti-reflective coating designed to transmit maximum light close to or at the peak wavelength of the specific light passing through the optic.

Figure 12B:
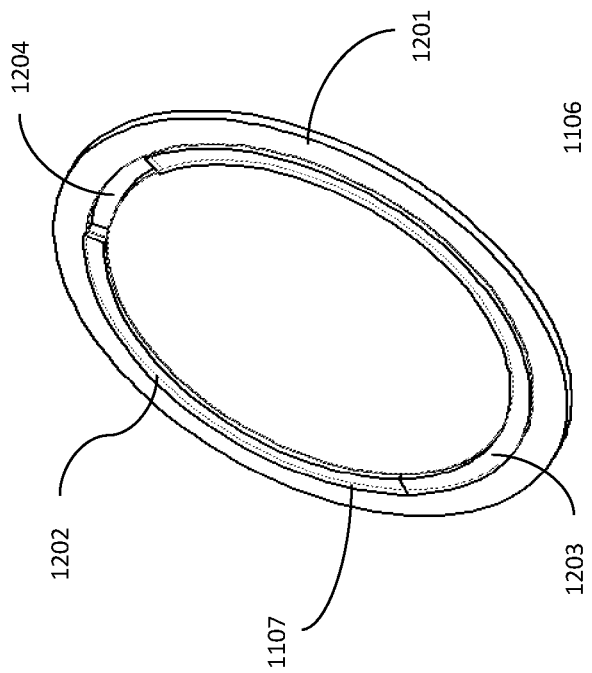
Figure 12A:
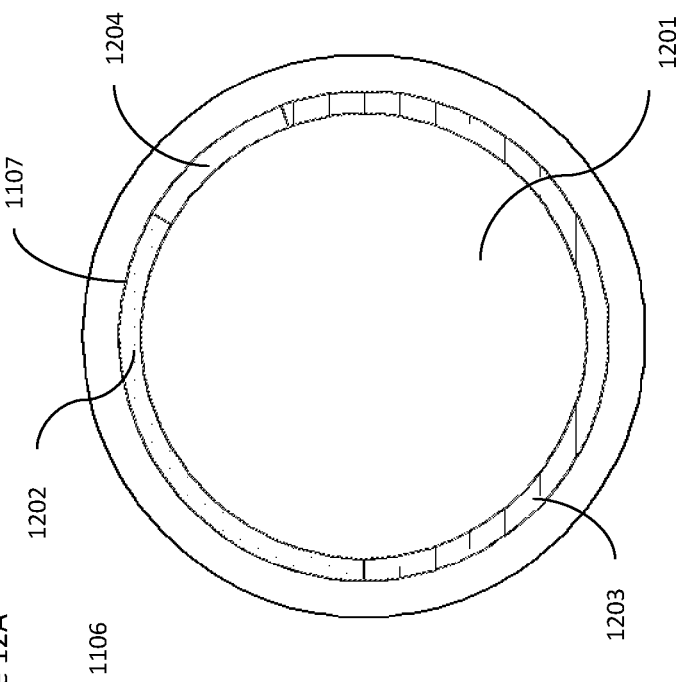
FIG. 12a Shows a front view of a wheel for use in a laser light source pumped phosphor projection engine, to enable wavelength conversion of the laser light source.

Referring to FIG. 11, a light source module [105] which emits blue laser light with a peak wavelength of 450 nm is aligned so that the combined beam output propagates through firstly a focusing lens [1101] and a collimating lens [1102] to converge the beam. The light is then incident on a beam splitter [1103] that reflects the beam through a 90° angle. The beam splitter [1103] is a glass cuboid with a dichroic coating on one face. The dichroic coating is reflective below a specific wavelength, for example 500 nm, so the beam splitting will predominantly reflect the blue laser light, and anything above this wavelength will be predominantly transmitted. The focused beam is incident on a rotating wheel [1106]. Referring to FIG. 12, the rotating wheel [1106] comprises a disc with a reflective surface [1201], upon which is disposed a segmented ring [1107]. The focused beam is incident on the ring [1107] at a position offset from the centre of the wheel such that the rotation of the wheel [1106] moves the segmented ring [1107] through the path of the beam. A motor drives the wheel [1106] to spin at a steady rotation, for example 120 rotations per second. The ring segments comprise two light conversion materials [1202][1203][1107], and a diffuser [1204]. A light conversion material can absorb a broad band of incoming higher energy light (in this example, blue laser light) and convert to and emit light of a lower energy. The first light conversion material [1202] is a segment of red phosphor material, with a peak emission wavelength between 600 and 700 nm, and an absorption band between 400 and 500 nm, such that blue light can be absorbed and a red light is emitted. To improve heat dissipation and prevent degradation of the phosphor material, the phosphor material is encapsulated in a resin. The ring [1107] comprises secondly a segment [1203] of green phosphor material, with a peak emission wavelength between 475 nm and 700 nm, and an absorption band between 400 and 500 nm, such that blue light can be absorbed, and green light is produced. A pair of lenses [1108] is disposed close to the ring [1107], axially centred around the point at which the light is incident on the ring [1107]. These lenses [1108] serve to both focus the laser light onto the ring [1107] and collect and collimate the light scattered and reflected back after the laser light has interacted with the light conversion material on the ring [1107]. The light that has been converted and collimated through this lens pair [1108] is subsequently incident on the beam splitting mirror [1103]. The light from both the first light conversion segment [1202] and the second light conversion segment [1203] is of longer wavelength than the reflection threshold for the beam splitter [1103], and so passes through the beam splitter [1103] without being reflected. The ring [1107] contains thirdly a diffuser segment [1204] for passing the blue light of the laser diodes [801] through the disc [1201]. The diffuser element [1204] serves to aid in de-speckling the laser light as it passes through the disc [1201], reducing light intensity variation of the throughput light. The diffuser segment [1204] is transmissive, in that the majority of light passes through the wheel [1106]. Light passed through the wheel [1106] subsequently passes through a collimation lens [1109] behind the wheel to restrain the divergence of the light, and then is reflected by three folding mirrors [1112] successively, each with a folding angle of 90°, such that that light is reflected back and is incident on the rear side of the beam splitter [402]. Because the light is of wavelength less than the transmissive threshold of the beam splitter [1103], it is reflected through a further 90° to be re-combined with the beam path of light that is scattered back by the light conversion material segments [1202] [1203]. The wheel [1106] rotates to produce a cyclic colour sequence from the laser light input such that a composite colour image can be produced. The light is subsequently focused by another lens [1110] into an integrating element [1104] of the same aspect ratio as an imaging element [1105]. The integrating element [1104] is an element that is designed to scramble the input light such that there is minimal intensity variation in the output, in this example the integrating element [1104] is comprised of a hollow rectangular tube of planar mirrors. The light undergoes multiple reflections on the internal walls and emerges from the end in a homogeneous state. This light is used to illuminate an imaging device [1105], in this example, a DMD (digital micro-mirror device). A DMD modulates the light using a 2D array of mirrors to produce a monochromatic image for each step in the illumination sequence. Time sequencing of monochromatic images, when viewed by eye, produces a composite colour video frame. A projection system [1113] enlarges the video reflected from the imaging device [1105] to produce images large enough for viewing.

An aspect of the invention, therefore, is a light source module for tight packing of multiple light sources that is also scalable. In exemplary embodiments, the light source module includes a plurality of light sources mounted in at least one block; the at least one block including a plurality of mounting pads for respectively mounting the plurality of light sources, said mounting pads occupying multiple planes in a direction normal to a direction of light emission from the light sources; and the at least one block further including a mating surface for combining the at least one block with an adjacent block, wherein said mating surface is parallel to the direction of light emission from the light sources. The light source module may include one or more of the following features, either individually or in combination.

In an exemplary embodiment of the light source module, each of the plurality of mounting pads defines a hole or groove disposed in the direction of light emission such that the light emission passes freely out of the block.

In an exemplary embodiment of the light source module, a portion of said mounting pads protrudes beyond the mating surface of the block, and on an opposite side of the block relative to the mating surface, the block includes a recess to accommodate a corresponding protrusion of an adjacent block such that when the adjacent block is positioned laterally relative to the mating surface of the at least one block, the mounting pads in the multiple planes overlap in a viewpoint direction along an axis normal to the mounting pads.

In an exemplary embodiment of the light source module, the mounting pads in the at least one block have one at least partially enclosed side and one open portion such that the mounted light sources are exposed externally from the block.

In an exemplary embodiment of the light source module, the light source module further includes a heat transport component for dissipating heat from the light source module.

In an exemplary embodiment of the light source module, the at least one block comprises a first section including a first group of light sources and a second section including a second group of light sources, and the heat transport component is positioned between first section and the second section.

In an exemplary embodiment of the light source module, the first and second sections of the block define a hole or groove such that the heat transport component is embedded within the block between the first and second sections.

In an exemplary embodiment of the light source module, the heat transport component is located at a rear side of the light source module separated from a packing of the light sources.

In an exemplary embodiment of the light source module, each of the plurality of light sources has a base portion, and base portions of adjacent light sources overlap with each other without blocking light emission from each other.

In an exemplary embodiment of the light source module, the light sources are semiconductor laser elements.

In an exemplary embodiment of the light source module, the mounting pads and/or the light sources are distributed in a regular tessellating pattern.

In an exemplary embodiment of the light source module, the mounting pads and/or the light sources are distributed in an irregular configuration.

In an exemplary embodiment of the light source module, each light source has an integrated lens element positioned in front of a semiconductor chip.

In an exemplary embodiment of the light source module, each of the plurality of light sources emits light of a same wavelength.

In an exemplary embodiment of the light source module, two or more of the plurality of light sources emit light of different wavelengths.

In an exemplary embodiment of the light source module, the at least one block comprises a first block and a second block, and the first and second blocks are positioned in a stacked configuration such that the mating surfaces of the first and second blocks face each other and are in contact.

In an exemplary embodiment of the light source module, the at least one block comprises a first block and a second block, and the first and second blocks are positioned in a stacked configuration such that the mating surfaces of the first and second blocks are in thermal contact via one of thermal paper, thermal paste, soldering or bonding.

In an exemplary embodiment of the light source module, the block further includes a plurality of retaining features positioned respectively in front of the plurality of light sources, and the light source module further comprises a plurality of lens elements respectively received within the retaining features.

In an exemplary embodiment of the light source module, the retaining features comprise recesses formed in the mating surface.

In an exemplary embodiment of the light source module, the lenses are connected to each other in a lens array in which each lens is positioned in front of a respective light source within a respective retaining feature.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

INDUSTRIAL APPLICABILITY

The invention described is applicable to multiple applications due to the scalability enabled by the invention. This includes but is not limited to industrial laser cutting machines and laser projection light sources.

What is claimed is:

1. A light source module comprising:
    a plurality of light sources mounted in at least one block;
    the at least one block including a plurality of mounting pads for respectively mounting the plurality of light sources, said mounting pads occupying multiple planes in a direction normal to a direction of light emission from the light sources; and
    the at least one block further including a mating surface for combining the at least one block with an adjacent block, wherein said mating surface is parallel to the direction of light emission from the light sources.

2. The light source module of claim 1, wherein each of the plurality of mounting pads defines a hole or groove disposed in the direction of light emission such that the light emission passes freely out of the block.

3. The light source module of claim 1, wherein a portion of said mounting pads protrudes beyond the mating surface of the block, and on an opposite side of the block relative to the mating surface, the block includes a recess to accommodate a corresponding protrusion of an adjacent block such that when the adjacent block is positioned laterally relative to the mating surface of the at least one block, the mounting pads in the multiple planes overlap in a viewpoint direction along an axis normal to the mounting pads.

4. The light source module of claim 1, wherein the mounting pads in the at least one block have one at least partially enclosed side and one open portion such that the mounted light sources are exposed externally from the block.

5. The light source module of claim 1, further comprising a heat transport component for dissipating heat from the light source module.

6. The light source module of claim 5, wherein the at least one block comprises a first section including a first group of light sources and a second section including a second group of light sources, and the heat transport component is positioned between first section and the second section.

7. The light source module of claim 6, wherein the first and second sections of the block define a hole or groove such that the heat transport component is embedded within the block between the first and second sections.

8. The light source module of claim 5, wherein the heat transport component is located at a rear side of the light source module separated from a packing of the light sources.

9. The light source module of claim 1, wherein each of the plurality of light sources has a base portion, and base portions of adjacent light sources overlap with each other without blocking light emission from each other.

10. The light source module of claim 1, wherein the light sources are semiconductor laser elements.

11. The light source module of claim 1, wherein the mounting pads and/or the light sources are distributed in a regular tessellating pattern.

12. The light source module of claim 1, wherein the mounting pads and/or the light sources are distributed in an irregular configuration.

13. The light source module of claim 1, wherein each light source has an integrated lens element positioned in front of a semiconductor chip.

14. The light source module of claim 1, wherein each of the plurality of light sources emits light of a same wavelength.

15. The light source module of claim 1, wherein two or more of the plurality of light sources emit light of different wavelengths.

16. The light source module of claim 1, wherein the at least one block comprises a first block and a second block, and the first and second blocks are positioned in a stacked configuration such that the mating surfaces of the first and second blocks face each other and are in contact.

17. The light source module of claim 1, wherein the at least one block comprises a first block and a second block, and the first and second blocks are positioned in a stacked configuration such that the mating surfaces of the first and second blocks are in thermal contact via one of thermal paper, thermal paste, soldering or bonding.

18. A light source module comprising:
a plurality of light sources mounted in at least one block;
the at least one block including a plurality of mounting pads for respectively mounting the plurality of light sources, said mounting pads occupying multiple planes in a direction normal to a direction of light emission from the light sources;
the at least one block further includes a mating surface for combining the at least one block with an adjacent block, wherein said mating surface is parallel to the direction of light emission from the light sources; and
wherein the block further includes a plurality of retaining features positioned respectively in front of the plurality of light sources, and the light source module further comprises a plurality of lens elements respectively received within the retaining features.

19. The light source module of claim 18, wherein the retaining features comprise recesses formed in the mating surface.

20. The light source module of claim 18, wherein the lenses are connected to each other in a lens array in which each lens is positioned in front of a respective light source within a respective retaining feature.

* * * * *